(12) United States Patent
Jeong et al.

(10) Patent No.: US 12,099,411 B2
(45) Date of Patent: Sep. 24, 2024

(54) ERROR PROCESSING CIRCUIT, MEMORY AND OPERATION METHOD OF THE MEMORY

(71) Applicant: SK hynix Inc., Gyeonggi-do (KR)

(72) Inventors: Jin Ho Jeong, Gyeonggi-do (KR); Hoiju Chung, San Jose, CA (US); Dae Suk Kim, Gyeonggi-do (KR); Munseon Jang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/169,880

(22) Filed: Feb. 16, 2023

(65) Prior Publication Data

US 2024/0126646 A1 Apr. 18, 2024

Related U.S. Application Data

(60) Provisional application No. 63/416,230, filed on Oct. 14, 2022.

(30) Foreign Application Priority Data

Nov. 11, 2022 (KR) ......................... 10-2022-0150709

(51) Int. Cl.
*G06F 11/10* (2006.01)
*H03M 13/29* (2006.01)

(52) U.S. Cl.
CPC ..... *G06F 11/1076* (2013.01); *H03M 13/2927* (2013.01)

(58) Field of Classification Search
CPC .................. G06F 11/1076; H03M 13/2927
See application file for complete search history.

(56) References Cited

U.S. PATENT DOCUMENTS

| | | | |
|---|---|---|---|
| 2017/0302299 A1* | 10/2017 | Lin | H03M 13/1102 |
| 2020/0091939 A1 | 3/2020 | Kuo | |
| 2022/0179741 A1* | 6/2022 | La Fetra | H03M 13/6513 |
| 2022/0269560 A1* | 8/2022 | Chung | H03M 13/1102 |
| 2022/0368351 A1* | 11/2022 | Jeong | G06F 11/1048 |

FOREIGN PATENT DOCUMENTS

KR 10-2021-0032810 A 3/2021

* cited by examiner

*Primary Examiner* — Cynthia Britt
(74) *Attorney, Agent, or Firm* — IP & T GROUP LLP

(57) ABSTRACT

An error processing circuit includes: a first H matrix calculation circuit configured to calculate a first H matrix and upstream data to generate a partial first parity, during an encoding operation; a second H matrix calculation circuit configured to calculate a second H matrix and the upstream data to generate a second parity, during the encoding operation; and a parity calculation circuit configured to sum the partial first parity and the second parity to generate a first parity, during the encoding operation.

19 Claims, 16 Drawing Sheets

FIG. 2

| DATA | | | | ECC | | | |
|---|---|---|---|---|---|---|---|
| D0 | D1 | D2 | D3 | E0 | E1 | E2 | E3 |
| 1 | 1 | 1 | 0 | 1 | 0 | 0 | 0 |
| 1 | 1 | 0 | 1 | 0 | 1 | 0 | 0 |
| 1 | 0 | 1 | 1 | 0 | 0 | 1 | 0 |
| 0 | 1 | 1 | 1 | 0 | 0 | 0 | 1 |

FIG. 3

| DATA | | | | ECC | | | |
|---|---|---|---|---|---|---|---|
| D0 | D1 | D2 | D3 | E0 | E1 | E2 | E3 |
| 1*D0 | 1*D1 | 1*D2 | 0*D3 | 1*E0 | 0*E1 | 0*E2 | 0*E3 |
| 1*D0 | 1*D1 | 0*D2 | 1*D3 | 0*E0 | 1*E1 | 0*E2 | 0*E3 |
| 1*D0 | 0*D1 | 1*D2 | 1*D3 | 0*E0 | 0*E1 | 1*E2 | 0*E3 |
| 0*D0 | 1*D1 | 1*D2 | 1*D3 | 0*E0 | 0*E1 | 0*E2 | 1*E3 |

$$\begin{pmatrix} 1 & 1 & 1 & 0 & 1 & 0 & 0 & 0 \\ 1 & 1 & 0 & 1 & 0 & 1 & 0 & 0 \\ 1 & 0 & 1 & 1 & 0 & 0 & 1 & 0 \\ 0 & 1 & 1 & 1 & 0 & 0 & 0 & 1 \end{pmatrix} \times \begin{pmatrix} D0 \\ D1 \\ D2 \\ D3 \\ E0 \\ E1 \\ E2 \\ E3 \end{pmatrix} = \begin{pmatrix} 0 \\ 0 \\ 0 \\ 0 \end{pmatrix}$$

(a)

$$\begin{pmatrix} 1 & 1 & 1 & 0 \\ 1 & 1 & 0 & 1 \\ 1 & 0 & 1 & 1 \\ 0 & 1 & 1 & 1 \end{pmatrix} \times \begin{pmatrix} D0 \\ D1 \\ D2 \\ D3 \end{pmatrix} = \begin{pmatrix} E0 \\ E1 \\ E2 \\ E3 \end{pmatrix}$$

| DATA' | | | | ECC | | | |
|---|---|---|---|---|---|---|---|
| D0' | D1' | D2' | D3' | E0 | E1 | E2 | E3 |
| 1*D0' | 1*D1' | 1*D2' | 0*D3' | 1*E0 | 0*E1 | 0*E2 | 0*E3 |
| 1*D0' | 1*D1' | 0*D2' | 1*D3' | 0*E0 | 1*E1 | 0*E2 | 0*E3 |
| 1*D0' | 0*D1' | 1*D2' | 1*D3' | 0*E0 | 0*E1 | 1*E2 | 0*E3 |
| 0*D0' | 1*D1' | 1*D2' | 1*D3' | 0*E0 | 0*E1 | 0*E2 | 1*E3 |

$$\begin{pmatrix} 1 & 1 & 1 & 0 & 1 & 0 & 0 & 0 \\ 1 & 1 & 0 & 1 & 0 & 1 & 0 & 0 \\ 1 & 0 & 1 & 1 & 0 & 0 & 1 & 0 \\ 0 & 1 & 1 & 1 & 0 & 0 & 0 & 1 \end{pmatrix} \times \begin{pmatrix} D0' \\ D1' \\ D2' \\ D3' \\ E0 \\ E1 \\ E2 \\ E3 \end{pmatrix} = \begin{pmatrix} S0 \\ S1 \\ S2 \\ S3 \end{pmatrix}$$

(a)

$$\begin{pmatrix} 1 & 1 & 1 & 0 \\ 1 & 1 & 0 & 1 \\ 1 & 0 & 1 & 1 \\ 0 & 1 & 1 & 1 \end{pmatrix} \times \begin{pmatrix} D0' \\ D1' \\ D2' \\ D3' \end{pmatrix} + \begin{pmatrix} E0 \\ E1 \\ E2 \\ E3 \end{pmatrix} = \begin{pmatrix} S0 \\ S1 \\ S2 \\ S3 \end{pmatrix}$$

FIG. 11
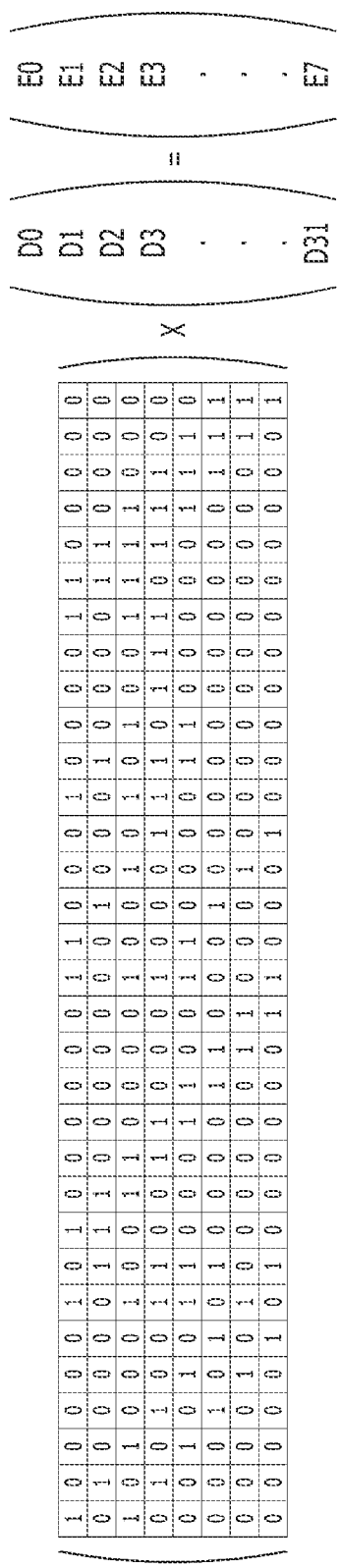
(a)
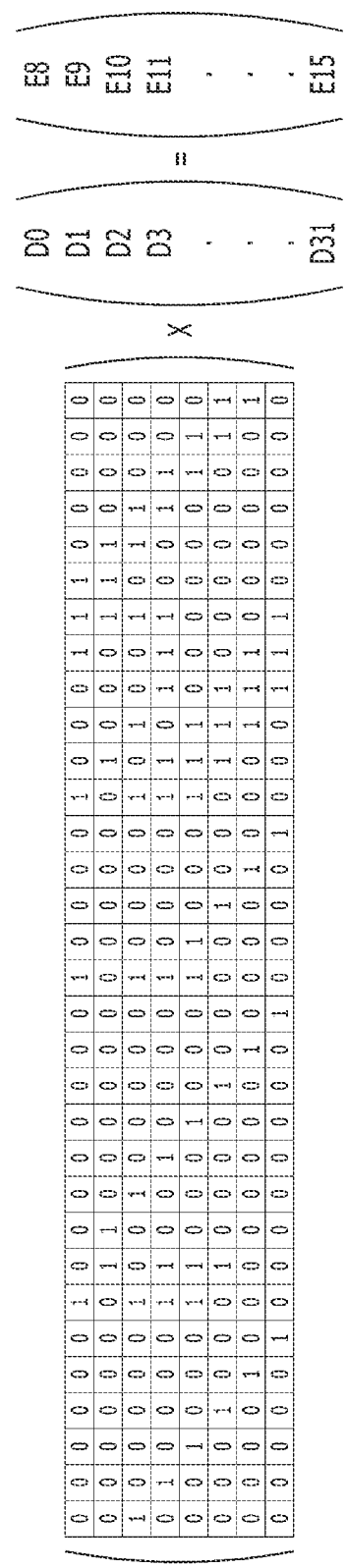
(b)

ERROR PROCESSING CIRCUIT, MEMORY AND OPERATION METHOD OF THE MEMORY

CROSS-REFERENCE TO RELATED APPLICATIONS

The present application claims priority to U.S. Provisional Patent Application No. 63/416,230, filed on Oct. 14, 2022 and Korean Patent Application No. 10-2022-0150709, filed on Nov. 11, 2022, which are both incorporated herein by reference in their entirety.

BACKGROUND

1. Field

Various embodiments of the present invention relate to a memory, and more particularly, to an error correction technique of a memory.

2. Description of the Related Art

In the early stage of a semiconductor memory device industry, there were many originally good dies on the wafers, which meant that memory chips were produced with no defective memory cells through a semiconductor fabrication process. However, as the capacity of memory devices increases, it becomes difficult to fabricate a memory device that does not have any defective memory cell, and nowadays, it may be said that there are substantially no chances that a memory device is fabricated without any defective memory cells. To address the issue, a repair method of including redundant memory cells in a memory device and replacing defective memory cells with the redundant memory cells is being used.

As another method, an error correction circuit (i.e., an ECC circuit) for correcting errors in a memory system is used to correct errors occurring in memory cells and errors occurring when data are transferred during a read operation and a write operation of the memory system.

SUMMARY

Embodiments of the present invention are directed to a technique for efficiently designing an error processing circuit for correcting errors.

In accordance with an embodiment of the present invention, an error processing circuit includes: a first H matrix calculation circuit configured to calculate a first H matrix and upstream data to generate a partial first parity, during an encoding operation; a second H matrix calculation circuit configured to calculate a second H matrix and the upstream data to generate a second parity, during the encoding operation; and a parity calculation circuit configured to sum the partial first parity and the second parity to generate a first parity, during the encoding operation.

In accordance with another embodiment of the present invention, an error processing circuit includes: a first H matrix calculation circuit configured to calculate a first H matrix and downstream data to generate a partial first downstream parity, during a decoding operation; a second H matrix calculation circuit configured to calculate a second H matrix and the downstream data to generate a second downstream parity, during the decoding operation; a parity restoration circuit configured to sum a first parity and a second parity to generate a restored partial first parity, during the decoding operation; a first syndrome calculation circuit configured to sum the restored partial first parity and the partial first downstream parity to generate a first syndrome, during the decoding operation; a second syndrome calculation circuit configured to sum the second parity and the second downstream parity for the decoding operation to generate a second syndrome, during the decoding operation; and a correction circuit configured to correct an error of the downstream data based on the first syndrome and the second syndrome.

In accordance with another embodiment of the present invention, a memory includes: a first H matrix calculation circuit configured to calculate a first H matrix and write data to generate a partial first parity, during a write operation; a second H matrix calculation circuit configured to calculate a second H matrix and the write data to generate a second parity, during the write operation; a parity calculation circuit configured to sum the partial first parity and the second parity to generate a first parity, during the write operation; and a memory core configured to store the write data, the first parity, and the second parity during a write operation.

In accordance with another embodiment of the present invention, a method for operating a memory includes: receiving write data; calculating matrix multiplication of a first H matrix and the write data to generate a partial first parity; calculating matrix multiplication of a second H matrix and the write data to generate a second parity; summing the partial first write parity and the second parity to generating a first parity; and storing the write data, the first parity, and the second parity in a memory core.

In accordance with another embodiment of the present invention, an operating method of a circuit includes: generating a first intermediate parity for upstream data according to a first H matrix; generating a second upstream parity for the upstream data according to a second H matrix; summing the first intermediate parity and the second upstream parity to generate a first upstream parity for the upstream data; and generating a codeword, which is to be provided to a medium and includes the upstream data and the first and second upstream parities, wherein the first and second H matrixes are respectively upper and lower halves of a whole H matrix suitable for generating a whole parity for the upstream data. The operating method further includes: obtaining, from the medium, the codeword including downstream data and first and second downstream parities; summing the first and second downstream parities to generate a second intermediate parity; generating a third parity for the downstream data according to the first H matrix; generating a fourth parity for the downstream data according to the second H matrix; summing the second intermediate parity and the third parity to generate a first syndrome; summing the second downstream parity and the fourth parity to generate a second syndrome; and error-correcting the downstream data according to the first and second syndromes.

In accordance with another embodiment of the present invention, an operating method for operating a memory includes: obtaining, from a medium, a codeword including downstream data and first and second downstream parities; summing the first and second downstream parities to generate a second intermediate parity; generating a third parity for the downstream data according to a first H matrix; generating a fourth parity for the downstream data according to a second H matrix; summing the second intermediate parity and the third parity to generate a first syndrome; summing the second downstream parity and the fourth parity to generate a second syndrome; and error-correcting the downstream data according to the first and second syndromes, wherein the first and second H matrixes are respectively upper and lower halves of a whole H matrix suitable for generating a whole parity for upstream data. The operating method further includes: generating the codeword to be provided to the medium and including the upstream data and first and second upstream parities, wherein the generating of the codeword includes: generating a first intermediate parity for the upstream data according to the first H matrix; generating the second upstream parity for the upstream data according to the second H matrix; and summing the first intermediate parity and the second upstream parity to generate the first upstream parity for the upstream data.

BRIEF DESCRIPTION OF THE DRAWINGS

FIG. 2 shows an example of an H matrix used by the error processing circuit of FIG. 1 in accordance with an embodiment of the present invention.

FIG. 3 shows a process that the error processing circuit generates an error correction code based on the H matrix of FIG. 2 in accordance with an embodiment of the present invention.

FIG. 4 expresses Equations 1 to 4 in the form of a matrix operation in accordance with an embodiment of the present invention.

FIG. 5 shows a process that the error processing circuit generates a syndrome in order to correct errors in downstream data based on the H matrix of FIG. 2 in accordance with an embodiment of the present invention.

FIG. 6 expresses Equations 5 to 8 in the form of a matrix operation in accordance with an embodiment of the present invention.

FIG. 7 shows an example of another H matrix that may be used by the error processing circuit of FIG. 1 in accordance with an embodiment of the present invention.

FIG. 8 shows an H matrix that is formed by modifying a portion of the H matrix shown in FIG. 7 corresponding to a portion of an error correction code not to form an identity matrix in accordance with an embodiment of the present invention.

FIG. 9 shows an H matrix that is formed by modifying the portion of the H matrix shown in FIG. 8 corresponding to the error correction code in the form of an identity matrix through a row operation in accordance with an embodiment of the present invention.

FIG. 11 is a view presented by dividing the process of FIG. 10 in accordance with an embodiment of the present invention.

DETAILED DESCRIPTION

Figure 1:
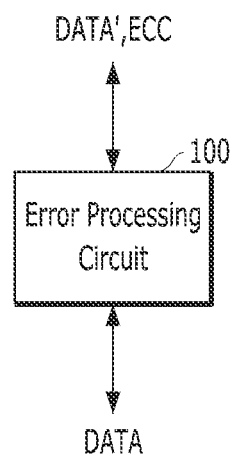
FIG. 1 is a block diagram illustrating an error processing circuit in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

FIG. 1 is a block diagram illustrating an error processing circuit 100 in accordance with an embodiment of the present invention.

The error processing circuit 100 may generate an error correction code ECC based on upstream data DATA during an encoding operation. The error processing circuit 100 may encode the upstream data DATA to generate the error correction code ECC for correcting an error of the data DATA. During the encoding operation, only the error correction code ECC may be generated, but an error correction operation may not be performed, Therefore, during the encoding operation, the data DATA that are input to the error processing circuit 100 and the data DATA' that are output from the error processing circuit 100 may be the same. Herein, the upstream data DATA may refer to the data that are input to the error processing circuit 100 to generate an error correction code ECC. When the error processing circuit 100 is applied to a memory, the upstream data DATA may be write data transferred from a memory controller, and an encoding operation for generating an error correction code ECC based on the upstream data DATA, that is, the write data, may be performed during a write operation of the memory.

The error processing circuit 100 may correct an error of downstream data DATA' based on an error correction code FCC during a decoding operation. Herein, correcting an error may mean detecting an error in the data DATA' based on the error correction code ECC and when there is an error detected, correcting the detected error. Herein, the downstream data DATA' may refer to the data that are input to the error processing circuit 100 for an error correction operation. When the error processing circuit 100 is applied to a memory, the downstream data DATA' may be the data that are read from memory cells, and the operation of correcting errors in the downstream data DATA' that are read from memory cells based on the error correction code ECC, that is, read data, may be performed during a read operation of the memory. When an error in the data DATA' is detected and corrected by the error processing circuit 100 during a decoding operation, the data DATA that are output from the error processing circuit 100, that is, error-corrected data, may be different from the data DATA' that are input to the error processing circuit 100.

The error processing circuit 100 may generate an error correction code ECC by using an H matrix, which is also called a check matrix, and correct an error based on the error correction code ECC, which will be described below.

FIG. 2 shows an example of an H matrix used by the error processing circuit 100 in accordance with an embodiment of the present invention. Herein, for the sake of convenience in description, the data DATA are of 4 bits D0 to D3 and the error correction code ECC is of 4 bits E0 to E3.

The H matrix may be formed of a matrix of (number of bits of error correction code)×(number of bits of data+number of bits of error correction code). Herein, since the error correction code ECC is of 4 bits and the data are of 4 bits, the H matrix may be formed of a 4×8 matrix. Each component of the H matrix may have a value of 1 or 0.

Column vectors of the H matrix may correspond to bits D0 to D3 of the data DATA and bits E0 to E3 of the error correction code ECC. For example, among the eight column vectors, four column vectors may correspond to the bits D0 to D3 of the data DATA and four column vectors may correspond to the bits E0 to E3 of the error correction code ECC. In FIG. 2, it may be seen that D1 corresponds to a column vector having a value of '1101' and E2 corresponds to a column vector having a value of '0010'.

Figure 3:
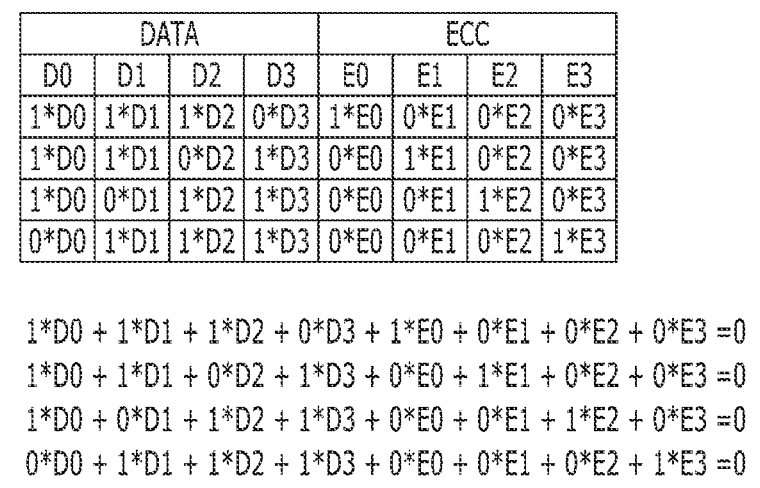

FIG. 3 shows a process that the error processing circuit 100 generates an error correction code ECC based on the H matrix of FIG. 2 in accordance with an embodiment of the present invention.

The error processing circuit 100 may multiply each of the column vectors of the H matrix by a corresponding bit and then generate an error correction code ECC such that the sum of each row becomes 0 (i.e., an even number).

That is, the error correction code ECC may be generated to satisfy the following four equations.

$1*D0+1*D1+1*D2+0*D3+1*E0+0*E1+0*E2+0*E3=0$ [Equation 1]

$1*D0+1*D1+0*D2+1*D3+0*E0+1*E1+0*E2+0*E3=0$ [Equation 2]

$1*D0+0*D1+1*D2+1*D3+0*E0+0*E1+1*E2+0*E3=0$ [Equation 3]

$0*D0+1*D1+1*D2+1*D3+0*E0+0*E1+0*E2+1*E3=0$ [Equation 4]

Herein, in the above equations and the following description, addition may mean exclusive OR. Therefore, the result of addition may be performed in such a manner that when the number of 1 is an even number, the result is 0, and when the number of 1 is an odd number, the result is 1. For example, 1+1+0+1=1, and 0+1+1+0=0.

FIG. 4 expresses Equations 1 to 4 in the form of a matrix operation in accordance with an embodiment of the present invention.

Referring to (a) of FIG. 4, Equations 1 to 4 may be expressed by calculating matrix multiplication of a 4×8 H matrix and the data D0 to D3 and the error correction code E0 to E3 that are expressed by an 8×1 matrix. It may be seen that the portion corresponding to the error correction code ECC in the 4×8 H matrix may be a 4×4 identity matrix.

Since the portion corresponding to the error correction code ECC in the H matrix is an identity matrix, (a) of FIG. 4 may be expressed as (b) of FIG. 4. Referring to (b) of FIG. 4, it may be seen that the error correction code E0 to E3 may be generated by calculating matrix multiplication of a 4×4 H matrix and the data D0 to D3 that are expressed by a 4×1 matrix. When the portion of the error correction code E0 to E3 of the H matrix is formed as an identity matrix as shown in FIG. 2, the error correction code E0 to E3 may be generated by simplifying the H matrix as shown in (b) of FIG. 4, and calculating only the simplified H matrix and the data D0 to D3.

Figure 5:
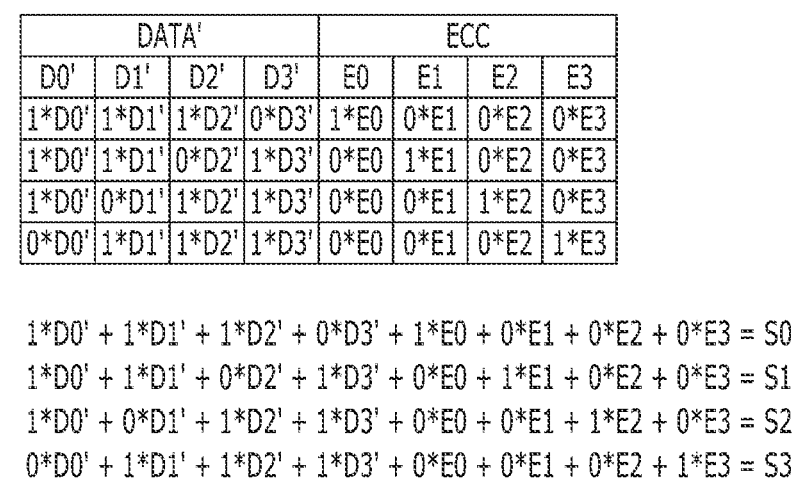

FIG. 5 shows a process that the error processing circuit 100 generates a syndrome S0 to S3 in order to correct errors in downstream data DATA' based on the H matrix of FIG. 2 in accordance with an embodiment of the present invention.

The error processing circuit 100 may generate the syndrome S0 to S3 by multiplying each of the column vectors of the H matrix with error correction target data DATA', that is, the downstream data, and the bits of the error correction code ECC, and then summing the resultant values for each row.

The process of generating the syndrome S0 to S3 may be expressed as the following Equations 5 to 9.

$1*D0'+1*D1'+1*D2'+0*D3'+1*E0+0*E1+0*E2+0*E3=S0$ [Equation 5]

$1*D0'+1*D1'+0*D2'+1*D3'+0*E0+1*E1+0*E2+0*E3=S1$ [Equation 6]

$1*D0'+0*D1'+1*D2'+1*D3'+0*E0+0*E1+1*E2+0*E3=S2$ [Equation 7]

$0*D0'+1*D1'+1*D2'+1*D3'+0*E0+0*E1+0*E2+1*E3=S3$ [Equation 8]

FIG. 6 expresses Equations 5 to 8 in the form of a matrix operation in accordance with an embodiment of the present invention.

Referring to (a) of FIG. 6, Equations 5 to 8 may be expressed by calculating matrix multiplication of a 4×8 H matrix and data D0' to D3' and the error correction code ECC that are expressed by an 8×1 matrix.

Since the portion corresponding to the error correction code E0 to E3 in the H matrix shown in (a) of FIG. 6 is an identity matrix, (a) of FIG. 6 may be expressed as (b) of FIG. 6. Referring to (b) of FIG. 6, the syndrome S0 to S3 may be generated by calculating matrix multiplication of a 4×4 matrix and the data D0' to D3 that are expressed by a 4×1 matrix and then adding the error correction code E0 to E3.

The generated syndrome S0 to S3 may indicate the presence or absence of an error, and the position of a portion where an error exists in the data D0' to D3' and the error correction code E0 to E3. When the value of the syndrome S0 to S3 is '0000', it may mean that there is no error in the data D0' to D3' and the error correction code F0 to E3.

When the value of the syndrome S0 to S3 is not '0000', it may indicate that an error exists. In this case, the value of the syndrome S0 to S3 may represent the bit having an error in the data D0' to D3' and the error correction code E0 to E3. Among the data D0' to D3' and the error correction code, the bit where the value of a column vector of the H matrix (see FIG. 5) is the same as the value of the syndrome S0 to S3 may be the bit with the error. For example, when the value of the syndrome S0 to S3 is '1101', the portion where the column vector of the H matrix (see FIG. 5) is '1101' is the bit D1' of the data. Therefore, the error may be corrected by inverting the bit D1' of the data. Also, when the value of the syndrome S0 to S3 is '1000', the portion where the column vector of the H matrix (see FIG. 5) is '1000' is the bit E0 of the error correction code. Therefore, the error may be corrected by inverting the error correction code. However, in many cases, the errors in the error correction code E0 to E3 do not have to be corrected. For example, during a read operation of a memory, the error correction code E0 to E3 may be used only for correcting errors and may not be sent out of the memory.

When the value of the syndrome S0 to S3 is not '0000' and the value of the syndrome S0 to S3 does not coincide with any one of the column vectors of the data D0' to D3' and the error correction code E0 to E3, it may mean that an error exists but the error processing circuit 100 cannot correct the error. For example, when the value of the syndrome S0 to S3 is '1100', the value '1100' does not exist among the column vectors of the data D0' to D3' and the error correction code E0 to E3. This may mean that an error exceeding the error correction capability of the processing circuit 100 has occurred.

Figure 7:
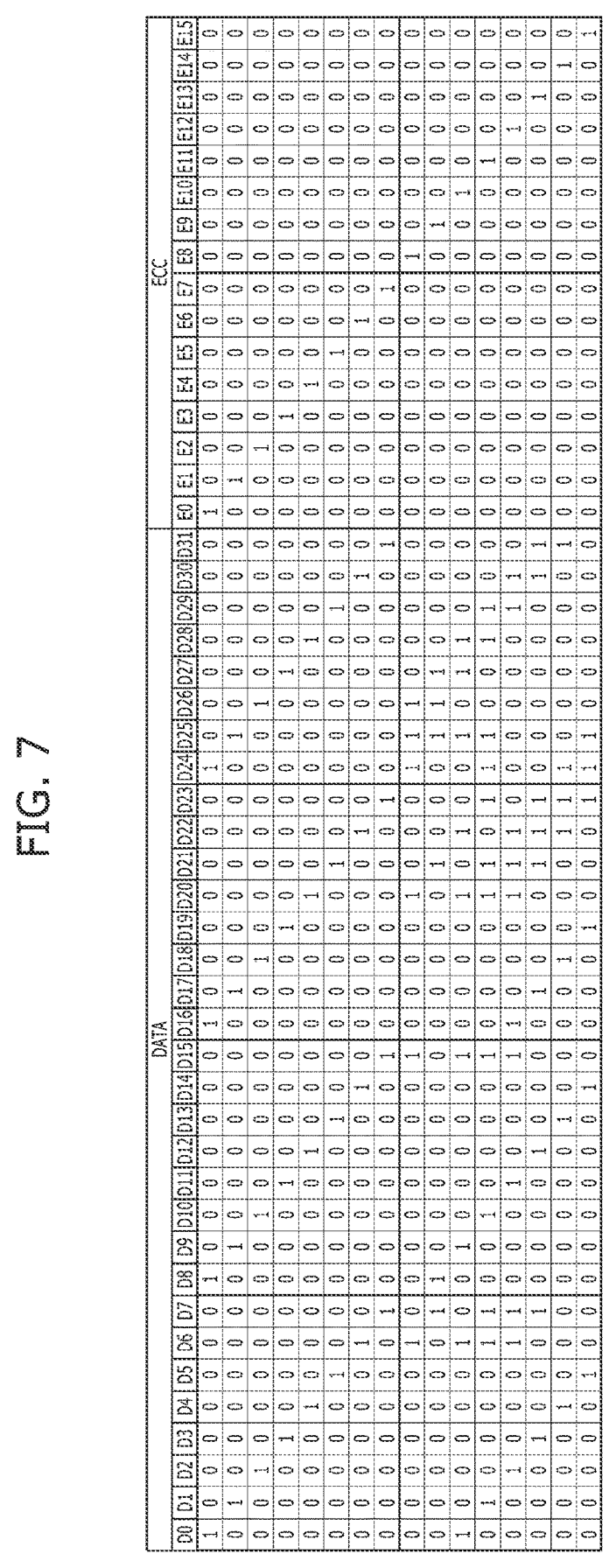

FIG. 7 shows an example of another H matrix that may be used by the error processing circuit 100 in accordance with an embodiment of the present invention. Herein, the data DATA are of 32 bits D0 to D31 and the error correction code ECC is of 16 bits E0 to E15.

Referring to FIG. 7, the H matrix may be a matrix having a size of 16×48. It may be seen that the error correction code portion of the H matrix is an identity matrix. For readability, the H matrix is divided into 8×8 sizes and grouped with thick lines.

When the error processing circuit 100 uses the H matrix of FIG. 7 and there is an error in the bit D12' of the data DATA', the value of the syndrome S0 to S15 may be generated to be '0000100000000100', and the error processing circuit 100 may correct the error by inverting the bit D12' of the data DATA' according to the value of the syndrome S0 to S15.

When there is an error in the bits EC and E9 of the error correction code ECC, the value of the syndrome S0 to S15 may be generated to be '1000000001000000' that is obtained by summing '1000000000000000', which is a column vector of the bits E0, and '0000000001000000', which is the column vector of the bit E9, When the syndrome S0 to S15 is generated to be '1000000001000000', the error processing circuit 100 may invert the bit D8' of the data DATA' whose column vector is '1000000001000000'.

In the case of using the H matrix of FIG. 7, when there is an error in the bit E0 and the bit E9 of the error correction code ECC, the error processing circuit 100 may perform a miscorrection of inverting the bit D8' of the error-free data DATA', during an error correction operation. When the error processing circuit 100 performs the miscorrection, the error of the data DATA' may not be decreased but rather the error of the data DATA' may be increased.

Figure 8:
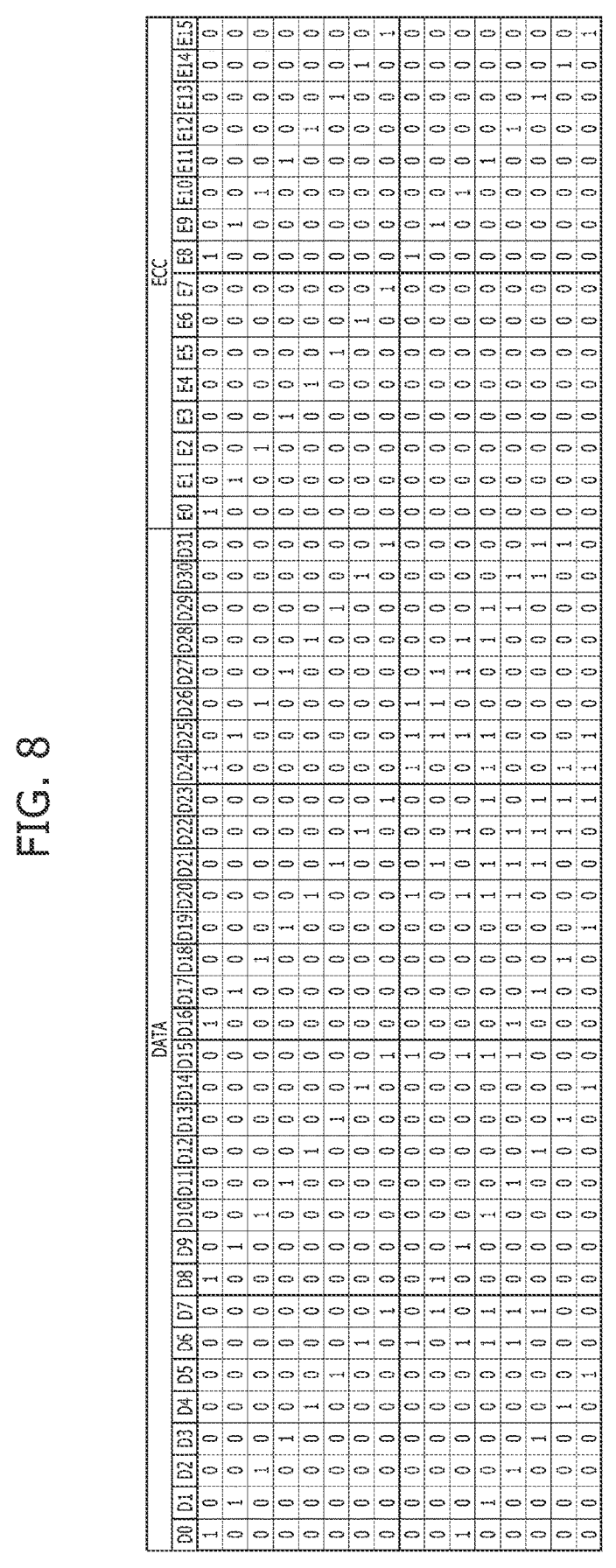

FIG. 8 shows an H matrix that is formed by modifying a portion of the H matrix shown in FIG. 7 corresponding to a portion E8 to E15 of an error correction code ECC not to form an identity matrix.

In the case of using the H matrix as shown in FIG. 8, when there is an error in the bit F0 and the bit E9 of the error correction code FCC, the value of the syndrome S0 to S15 may be generated to be '1100000001000000' that is obtained by summing '1000000000000000', which is the column vector of the bit E0, and '0100000001000000', which is the column vector of the bit E9. In this case, since '1100000001000000' does not exist among the column vectors of the data DATA' and the error correction code ECC, no error may be corrected. Namely, a phenomenon that the error of the data DATA' is increased due to miscorrection may not occur.

The occurrence of miscorrection may be reduced by changing the portion corresponding to the error correction code FCC in the H matrix into a form other than the form of an identity matrix. This effect may be more effective as the number of the bits of the data DATA' increases. For example, as the number of the bits of the data DATA' is larger, such as 256 bits, the effect of reducing the occurrence of miscorrection may be increased by changing the portion corresponding to the error correction code ECC in the H matrix into a form other than the form of an identity matrix.

When the portion corresponding to the error correction code FCC in the H matrix is in the form of an identity matrix, it may be possible to simplify the process of generating an error correction code FCC like the change from (a) to (b) of FIG. 4, and to simplify the process of generating a syndrome, like the change from (a) to (b) of FIG. 6. Also, since the same type of a matrix multiplication operation is performed in the encoding process (i.e., the process of generating an error correction code) and the decoding process (i.e., the process of generating a syndrome for error correction), it may be possible to share circuits for the encoding and the decoding. Thus, it is possible to simplify the calculation and reduce the circuit area of the error processing circuit 100 for calculation by forming the portion corresponding to the error correction code ECC in the H matrix in the form of an identity matrix.

Figure 9:
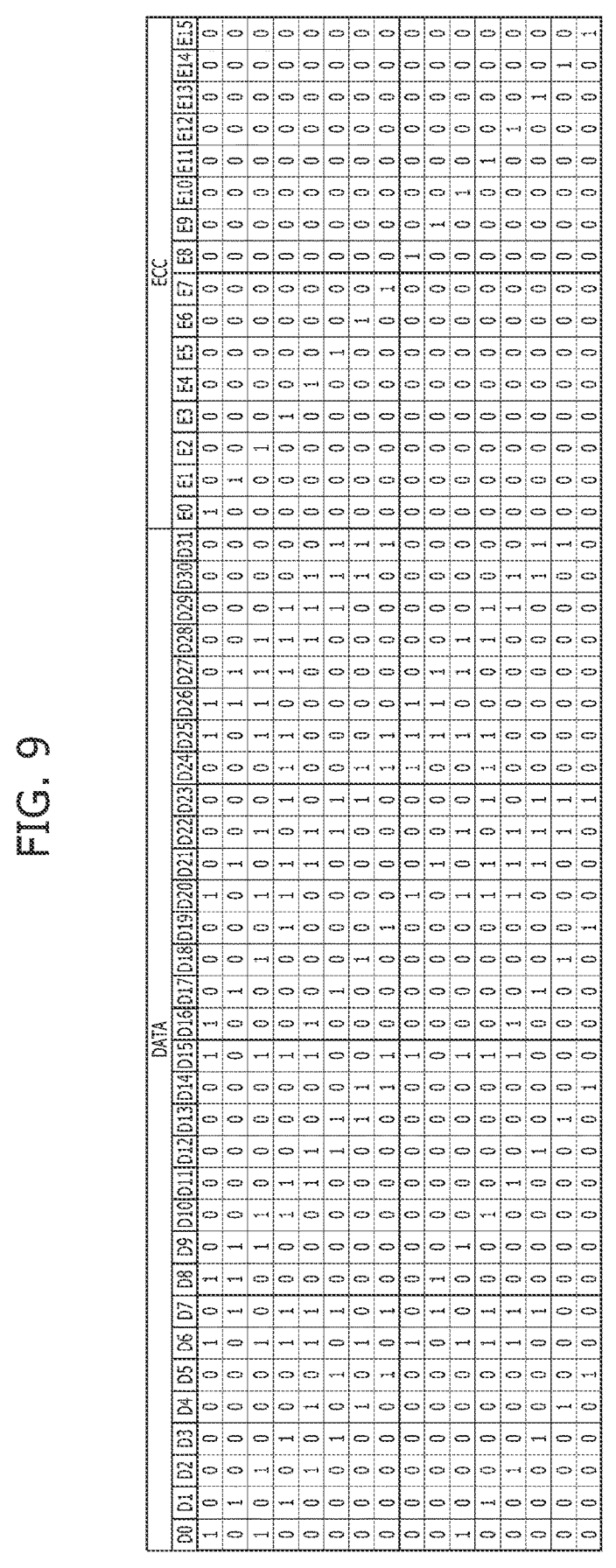

FIG. 9 shows an H matrix that is formed by modifying the portion of the H matrix shown in FIG. 8 corresponding to the error correction code ECC in the form of an identity matrix through a row operation in accordance with an embodiment of the present invention.

When the H matrix of FIG. 9 is used, an advantage that comes from the fact that the portion corresponding to the error correction code ECC described above is in the form of an identity matrix may be obtained. However, it may be seen that the H matrix of FIG. 9 has a significantly increased number of '1' compared to the H matrix of FIG. 8. The larger the number of '1' there is in the H matrix, the more calculations are required, which may mean that the area of the error processing circuit 100 increases.

Figure 10:
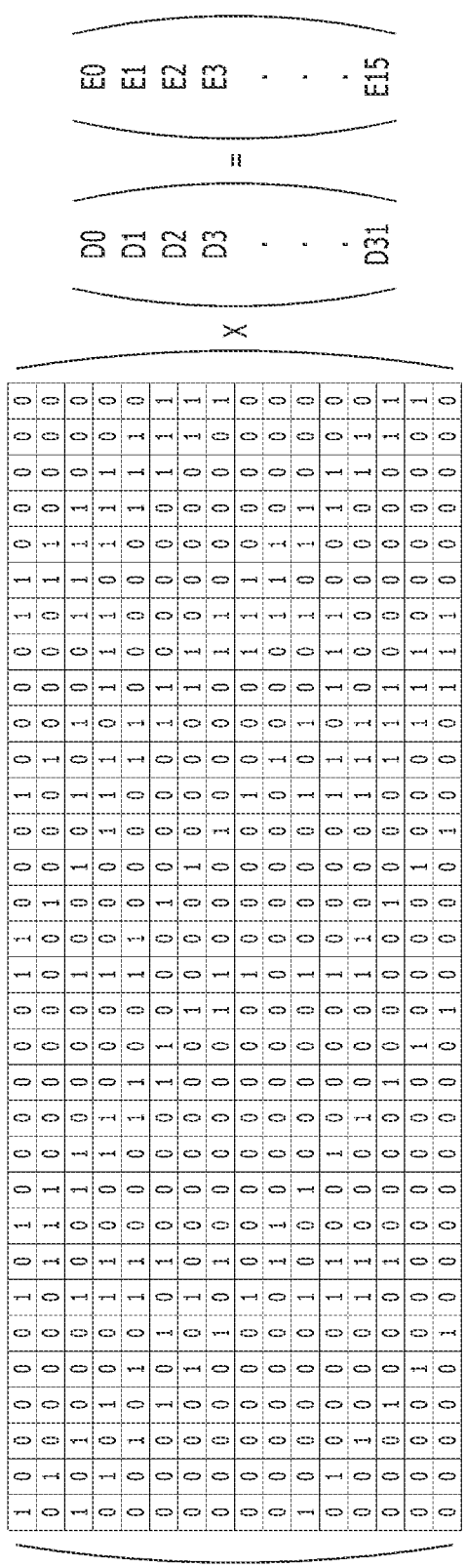
FIG. 10 expresses a process of generating an error correction code shown in FIG. 9 in the form of matrix multiplication in accordance with an embodiment of the present invention.

A process of generating an error correction code ECC E0 to E15 based on the H matrix of FIG. 9 may be expressed as an equation of a matrix multiplication shown in FIG. 10 in accordance with an embodiment of the present invention.

Matrix multiplication that is used to generate the bits F0 to E7 of the error correction code ECC shown in FIG. 10 may be represented as shown in (a) of FIG. 11, and matrix multiplication that is used to generate the bits E8 to E15 of the error correction code FCC shown in FIG. 10 may be represented as shown in (b) of FIG. 11 in accordance with an embodiment of the present invention.

Referring to (a) of FIG. 11, it may be seen that the H matrix that is used in (a) of FIG. 11 is the same as what is obtained by summing an 8×32 matrix in the upper part and an 8×32 matrix in the lower part of the 16×32 matrix of the data portion of the H matrix shown in FIG. 7.

Figure 12:
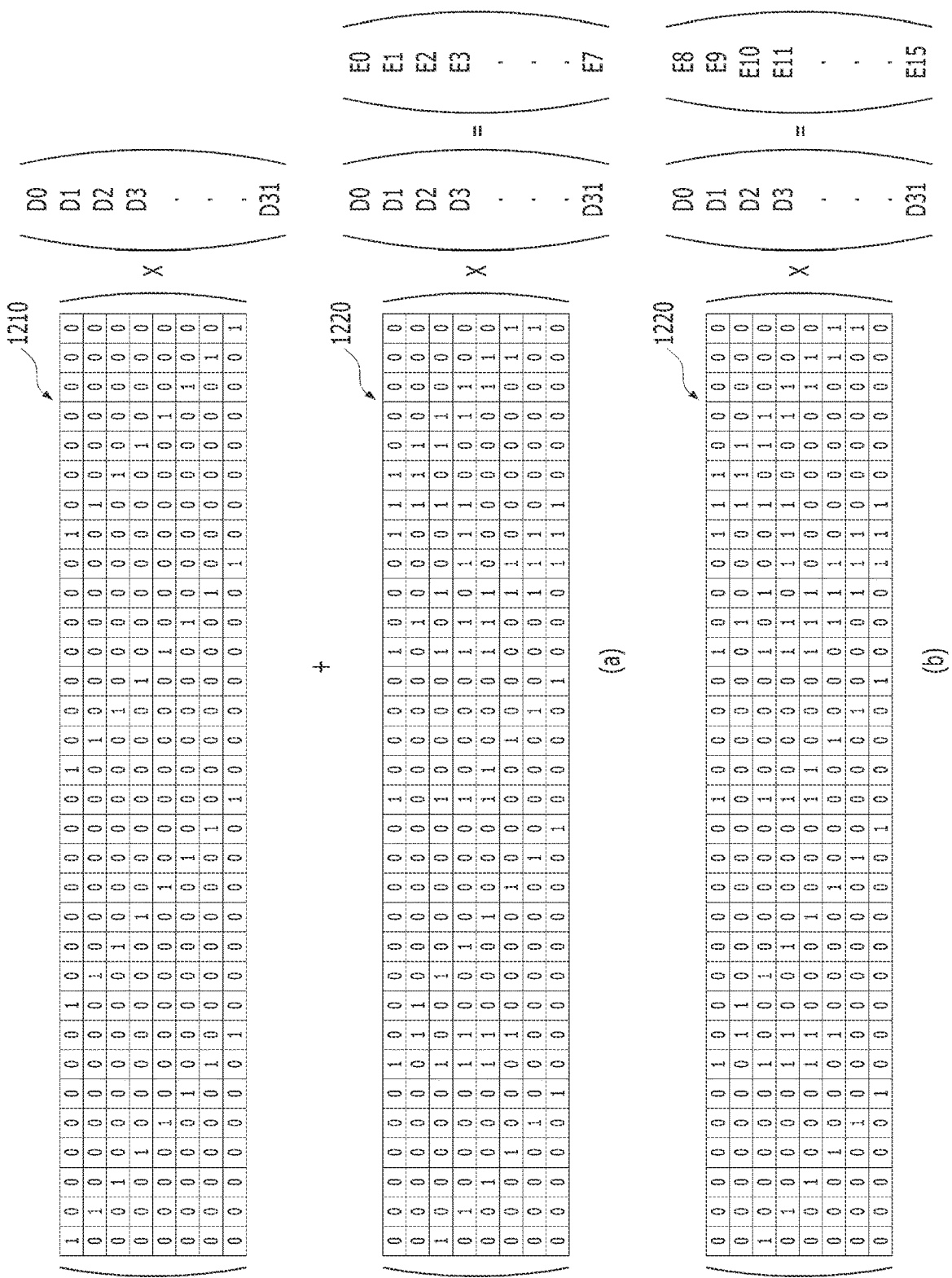
FIG. 12 is a different representation of FIG. 11 in accordance with an embodiment of the present invention.

Namely, (a) and (b) of FIG. 11 may be arranged as shown in (a) and (b) of FIG. 12. Referring to (a) and (b) of FIG. 12, it may be seen that the complex matrix operation as shown in (a) of FIG. 11 may be expressed as the sum of simple matrix operations as shown in (a) of FIG. 12 in accordance with an embodiment of the present invention. Hereinafter, '1210' in FIG. 12 is referred to as a first H matrix, and '1220' is referred to as a second H matrix. Also, in the error correction code FCC, the bits E0 to E7 are referred to as a first parity P0, and the bits E8 to E15 are referred to as a second parity P1.

Figure 13:
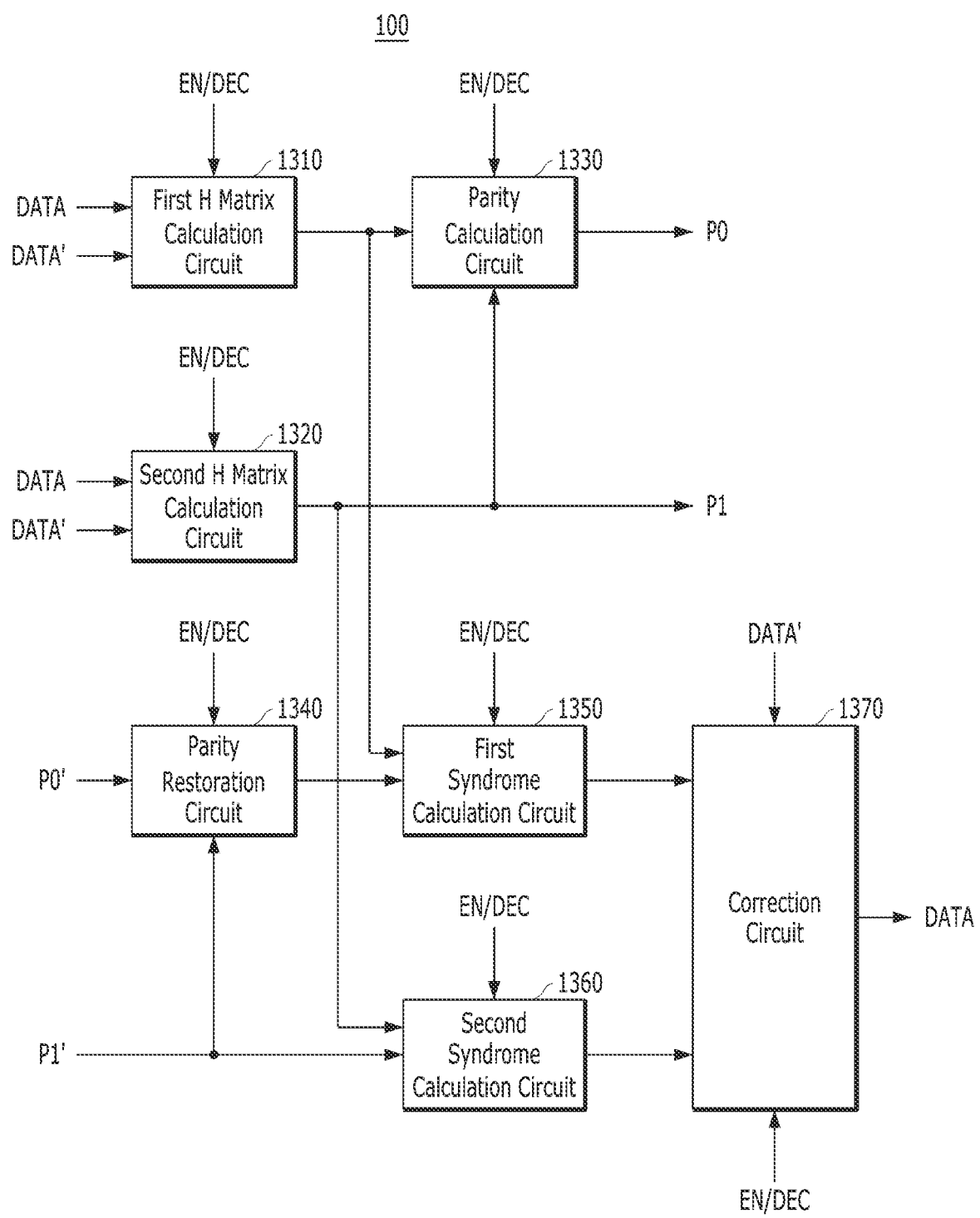
FIG. 13 is a block diagram illustrating the error processing circuit of FIG. 1 in accordance with an embodiment of the present invention.

FIG. 13 is a block diagram illustrating the error processing circuit 100 of FIG. 1 in accordance with an embodiment of the present invention. The error processing circuit 100 shown in FIG. 13 may perform the same encoding and decoding operations as those calculated using the H matrices of FIGS. 8 and 9, which are matrices of a more complicated form than the first H matrix 1210 and the second H matrix 1220, while performing a calculation operation using the first H matrix 1210 and the second H matrix 1220 which are matrices of a simplified form.

Referring to FIG. 13, the error processing circuit 100 may include a first H matrix calculation circuit 1310, a second H matrix calculation circuit 1320, a parity calculation circuit 1330, a parity restoration circuit 1340, a first syndrome calculation circuit 1350, a second syndrome calculation circuit 1360, and a correction circuit 1370.

During an encoding operation in which the error processing circuit 100 generates an error correction code (ECC=P0+P1), the first H matrix calculation circuit 1310, the second H matrix calculation circuit 1320, and the parity calculation circuit 1330 may be used.

During a decoding operation in which the error processing circuit 100 corrects an error of data DATA' based on an error correction code (ECC=P0'+P1'), the first H matrix calculation circuit 1310, the second H matrix calculation circuit 1320, the parity restoration circuit 1340, the first syndrome calculation circuit 1350, the second syndrome calculation circuit 1360, and the correction circuit 1370 may be used.

An encoding/decoding signal EN/DEC may be a signal that is activated during an encoding operation and deactivated during a decoding operation to distinguish an encoding operation and a decoding operation from each other. The first parity P0' and the second parity P1' input to the error processing circuit 100 during a decoding operation are denoted by an apostrophe (') in order to distinguish the first parity P0 and the second parity P1 generated by the error processing circuit 100 during an encoding operation from the first parity P0' and the second parity P1' that are input to the error processing circuit 100 for error correction during a decoding operation.

Figure 14:
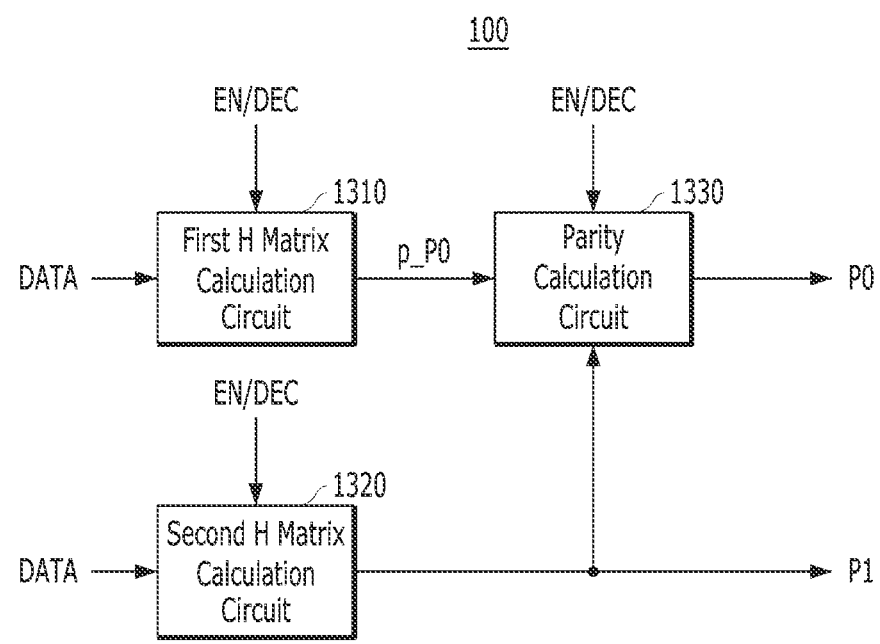
FIG. 14 is a block diagram illustrating an encoding operation of the error processing circuit shown in FIG. 13 in accordance with an embodiment of the present invention.

FIG. 14 is a block diagram illustrating an encoding operation of the error processing circuit 100 shown in FIG. 13 in accordance with an embodiment of the present invention. FIG. 14 shows constituent elements that are used for an encoding operation among the constituent elements of FIG. 13.

The first H matrix calculation circuit 1310 may be able to generate a partial first parity p_P0 by calculating the first H matrix 1210 and upstream data DATA during an encoding operation in which the encoding/decoding signal EN/DEC is activated. To be specific, the first H matrix calculation circuit 1310 may generate the partial first parity p_P0 by calculating matrix multiplication of the first H matrix 1210 and the upstream data DATA as shown in the front portion of (a) of FIG. 12.

The second H matrix calculation circuit 1320 may generate the second parity P1 by calculating the second H matrix 1220 and the upstream data DATA during an encoding operation in which the encoding/decoding signal EN/DEC is activated. To be specific, the second H matrix calculation circuit 1320 may generate the second parity P1 (i.e., E8 to E15) by calculating matrix multiplication of the second H matrix 1220 and the upstream data DATA as shown in (b) of FIG. 12.

During an encoding operation in which the encoding/decoding signal EN/DEC is activated, the parity calculation circuit 1330 may generate the first parity P0 by summing the partial first parity p_P0 and the second parity P1. The parity calculation circuit 1330 may generate the first parity P0 (i.e., E0 to E7) by summing the partial first parity p_P0 shown in the front portion of (a) of FIG. 12, and the second parity P1 shown in (b) of FIG. 12. The parity calculation circuit 1330 may be deactivated and may not operate during a decoding operation in which the encoding/decoding signal EN/DEC is deactivated.

Referring to FIG. 14, the error processing circuit 100 may be able to generate the same first parity P0 that is obtained by using the complicated H matrix shown in (a) of FIG. 11 by calculating matrix multiplication based on the first H matrix 1210 and the second H matrix 1220 which have a simple form and summing the result. The first parity P0 may be generated by a simple operation as shown in (a) of FIG. 12 instead of the complicated operation as shown in (a) of FIG. 11.

Figure 15:
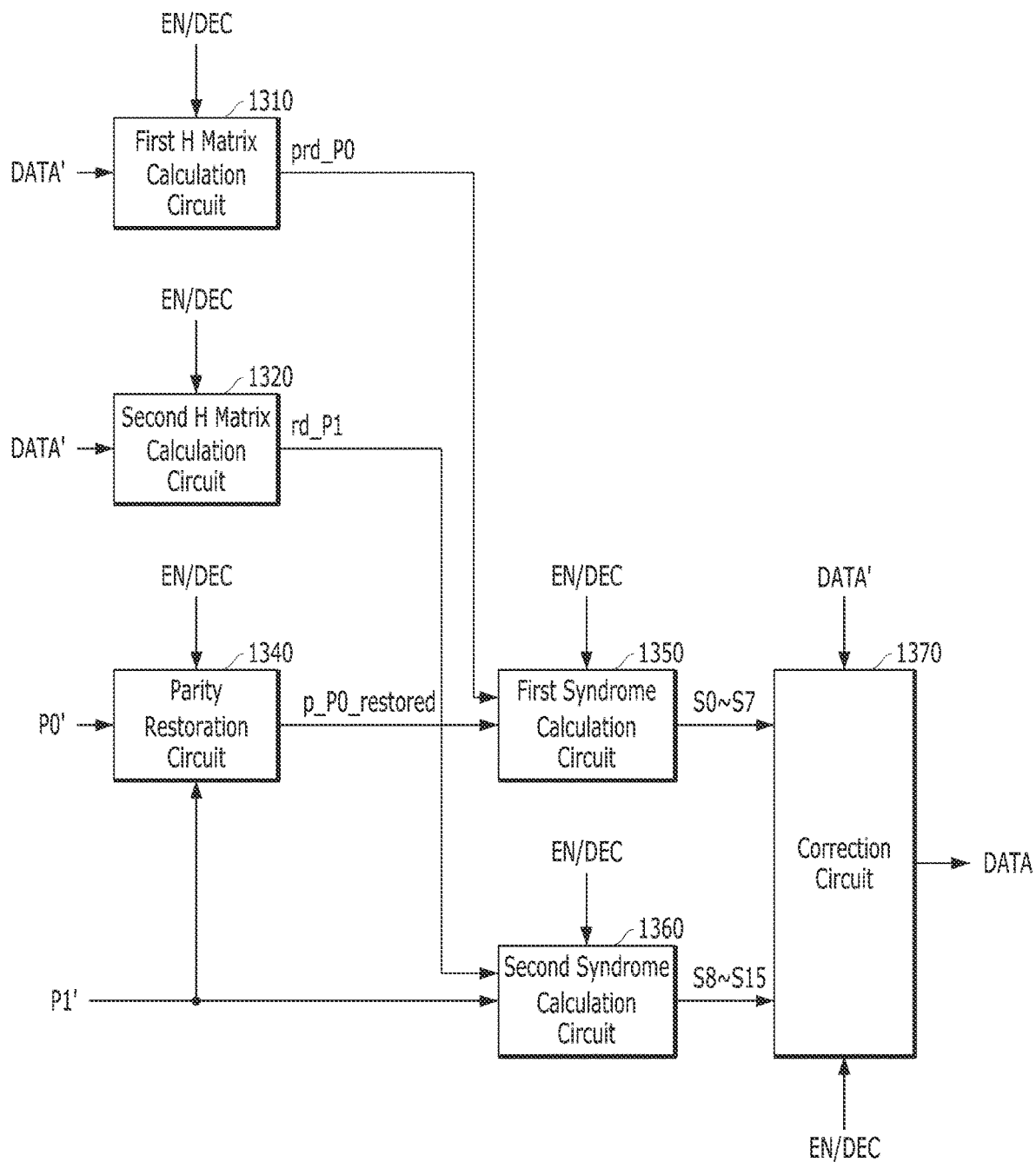
FIG. 15 is a block diagram illustrating a decoding operation of the error processing circuit 100 shown in FIG. 13 in accordance with an embodiment of the present invention.

FIG. 15 is a block diagram illustrating a decoding operation of the error processing circuit 100 shown in FIG. 13 in accordance with an embodiment of the present invention, FIG. 15 shows constituent elements that are used for a decoding operation among the constituent elements of FIG. 13.

The first H matrix calculation circuit 1310 may generate the partial first downstream parity prd_P0 by calculating the first H matrix 1210 and the downstream data DATA' during a decoding operation in which the encoding/decoding signal EN/DEC is deactivated. The first H matrix calculation circuit 1310 may perform the same matrix multiplication operation as performed in an encoding operation during a decoding operation, but there is a difference in that the object of the matrix multiplication operation is the upstream data DATA during the encoding operation, and downstream data DATA' during the decoding operation.

The second H matrix calculation circuit 1320 may generate a second downstream parity rd_P1 by calculating the second H matrix 1220 and the downstream data DATA' during a decoding operation in which the encoding/decoding signal EN/DEC is deactivated.

The parity restoration circuit 1340 may generate a restored partial first parity p_P0_restored by summing the first parity P0' and the second parity P1'. Since the first parity P0' input to the parity restoration circuit 1340 is generated by summing the partial first parity p_P0 and the second parity P1 during an encoding operation, the partial first parity p_P0 that is generated during an encoding operation may be restored by summing the first parity P0' and the second parity P0'(in the case of an XOR operation, summing and subtraction may be the same), the partial first parity p_P0 may be restored. The restored partial first parity p_P0_restored that is generated by the parity restoration circuit 1340 may correspond to this. The parity restoration circuit 1340 may be deactivated and may not operate during an encoding operation in which the encoding/decoding signal EN/DEC is activated.

The first syndrome calculation circuit 1350 may generate a first syndrome S0 to S7 by summing the partial first downstream parity prd_P0 and the restored partial first parity p_P0_restored. The partial first downstream parity prd_P0 may be a parity that is generated by the first H matrix calculation circuit 1310 based on the downstream data DATA', and the restored partial first parity p_P0_restored may be a parity obtained by restoring the partial first parity p_P0 generated during an encoding operation based on the upstream data DATA. Therefore, the first syndrome S0 to S7 may be generated by summing the two parities prd_P0 and p_P0_restored. The first syndrome calculation circuit 1350 may be deactivated and may not operate during an encoding operation in which the encoding/decoding signal EN/DEC is activated.

The second syndrome calculation circuit 1360 may generate a second syndrome S8 to S15 by summing the second parity P1' and the second downstream parity rd_P1. The second syndrome calculation circuit 1360 may be deactivated and may not operate during an encoding operation in which the encoding/decoding signal EN/DEC is activated.

The correction circuit 1370 may correct an error of the downstream data DATA' based on the first syndrome S0 to S7 and the second syndrome S8 to S15. The correction circuit 1370 may determine that there is no error in the downstream data DATA' when the values of the first syndrome S0 to S7 and the second syndrome S8 to S15 are all zero. In this case, the data DATA' input to the correction circuit 1370 and the data DATA output from the correction circuit 1370 may be the same.

When all the values of the first syndrome S0 to S7 and second syndrome S8 to S15 are not zero, the correction circuit 1370 may correct an error of the downstream data DATA' by inverting the bit whose value of the column vector in the downstream data DATA' is the same as the values of the first syndrome S0 to S7 and the second syndrome S8 to S15. Herein, the reference H matrix may be the first H matrix 1210 and the second H matrix 1220. The correction circuit 1370 may correct an error of the downstream data DATA' based on the check matrix of FIG. 7. For example, when the value of the first syndrome S0 to S7 and the second syndrome S8 to S15 is '0010000000010000', the correction circuit 1370 may correct an error by inverting the bit D10' of the data DATA' corresponding to the same column vector, and when the values of the first syndrome S0 to S7 and the second syndrome S8 to S15 are '0100000011110001', the correction circuit 1370 may correct an error by inverting the bit D25' of the data DATA' corresponding to the same column vector. The correction circuit 1370 may be deactivated and may not operate during an encoding operation in which the encoding/decoding signal EN/DEC is activated.

As described above, the error processing circuit 100 may be able to perform the same encoding and decoding operations as those performed using the H matrices of FIGS. 8 and 9, which are matrices of a complicated form, while calculating matrix operation using the first H matrix 1210 and the second H matrix 1220, which are check matrices of a simplified form.

Figure 16:
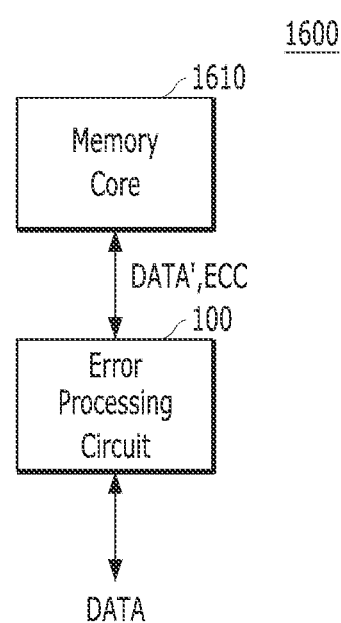
FIG. 16 is a block diagram illustrating a memory in accordance with an embodiment of the present invention.

FIG. 16 is a block diagram illustrating a memory 1600 in accordance with an embodiment of the present invention.

Referring to FIG. 16, the memory 1600 may include an error processing circuit 100 and a memory core 1610.

The error processing circuit 100 may perform an encoding operation of generating an error correction code ECC based on write data DATA during a write operation of the memory 1600, and may correct an error of read data DATA' that are read from the memory core 1610 based on the error correction code ECC that is read from the memory core 1610 during a read operation of the memory 1600. The error processing circuit 100 may operate as shown in FIG. 13. When the error processing circuit 100 is applied to the memory 1600, the term 'upstream' which is mentioned above may be replaced with a term 'write', and the term 'downstream' may be replaced with a term 'read'.

During a write operation, the memory core 1610 may receive and store write data (DATA'=DATA, Data are the same during a write operation) and an error correction code ECC which is generated by the error processing circuit 100. Also, during a read operation, the memory core 1610 may transfer the stored data DATA' and the error correction code ECC to the error processing circuit 100. The memory core 1610 may mean that data are stored in the memory 1600, and the memory core 1610 may include a plurality of memory cells for storing data and circuits for writing and reading data to and from the memory cells.

Hereafter, how to process data errors during a write operation and a read operation of the memory 1600 will be described.

Write Operation

During a write operation, write data DATA may be transferred from a memory controller to the memory 1600, and the write data DATA may be input to the error processing circuit 100.

The first H matrix calculation circuit 1310 (see FIG. 13) of the error processing circuit 100 may generate a partial first parity p_P0 by calculating matrix multiplication of the first H matrix 1210 and the write data DATA. Also, the second H matrix calculation circuit 1320 of the error processing circuit 100 may generate a second parity P0 by calculating matrix multiplication of the second H matrix 1220 and the write data DATA. The parity calculation circuit 1330 may generate a first parity P0 by summing the partial first parity p_P0 and the second parity P0.

The write data (DATA'=DATA, Data are the same during a write operation) and the error correction code (ECC=P0+P1) which is generated by the error processing circuit 100 may be written into the memory core 1610.

Read Operation

During a read operation, data DATA' and an error correction code (ECC=P0'+P1') may be read from the memory core 1610.

The first H matrix calculation circuit 1310 of the error processing circuit 100 may generate a partial first read (downstream) parity prd_P0 by calculating matrix multiplication of the first H matrix 1210 and the read data DATA'). The second H matrix calculation circuit 1320 may generate a second read (downstream) parity rd_P1 by calculating matrix multiplication of the second H matrix 1220 and the read data DATA'. The parity restoration circuit 1340 may generate a restored partial first parity p_P0_restored by summing the first parity P0' and the second parity P1' that are read from the memory core 1610. The first syndrome calculation circuit 1350 may generate a first syndrome S0 to S7 by summing the partial first read parity prd_P0 and the restored partial first parity p_P0_restored. The second syndrome calculation circuit 1360 may generate a second syndrome S8 to S15 by summing the second parity P1' and the second read parity rd_P1 that are read from the memory core 1610. Also, the correction circuit 1370 may correct an error in the data DATA' based on the first syndrome S0 to S7 and the second syndrome S8 to S15.

The data DATA whose error is corrected by the error processing circuit 100 may be transferred to the memory controller. Herein, the error-corrected data DATA may be different from the data DATA' when an error is detected in the data DATA', and when no error is detected in the data DATA', the error-corrected data DATA may be the same as the data DATA'.

According to the embodiment of the present invention, an error processing circuit for correcting errors may be designed efficiently.

While the present invention has been described with respect to the specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. An error processing circuit comprising:
a first H matrix calculation circuit configured to calculate a first H matrix and upstream data to generate a partial first parity, during an encoding operation;
a second H matrix calculation circuit configured to calculate a second H matrix and the upstream data to generate a second parity, during the encoding operation;
a parity calculation circuit configured to sum the partial first parity and the second parity to generate a first parity, during the encoding operation; and
a correction circuit configured to, based on syndromes calculated using the first H matrix and the second H matrix, correct errors in read data read from a memory,
wherein the error processing circuit outputs error corrected data.

2. The error processing circuit of claim 1, wherein:
the first H matrix calculation circuit is further configured to calculate the first H matrix and downstream data to generate a partial first downstream parity, during a decoding operation, and
the second H matrix calculation circuit is further configured to calculate the second H matrix and the downstream data to generate a second downstream parity, during the decoding operation.

3. The error processing circuit of claim 2, further comprising:
a parity restoration circuit configured to sum the first parity transferred for a decoding operation and the second parity transferred for the decoding operation to generate a restored partial first parity, during the decoding operation;
a first syndrome calculation circuit configured to sum the restored partial first parity and the partial first downstream parity to generate a first syndrome, during the decoding operation; and
a second syndrome calculation circuit configured to sum the second parity transferred for the decoding operation and the second downstream parity to generate a second syndrome, during the decoding operation,
wherein the correction circuit is configured to correct an error of the downstream data based on the first syndrome and the second syndrome.

4. The error processing circuit of claim 3, wherein the correction circuit determines that there is no error in the downstream data, when values of the first syndrome and the second syndrome are all '0'.

5. The error processing circuit of claim 3, wherein the correction circuit corrects the error by inverting bits corresponding to the values of the first syndrome and the second syndrome among multiple bits of the downstream data.

6. The error processing circuit of claim 1,
wherein the upstream data are of N bits, where N is an integer equal to or greater than 2, the first parity is of M bits, where M is an integer equal to or greater than 2, and the first H matrix is a (M×N) matrix, and
wherein the first H matrix calculation circuit generates the partial first parity by calculating matrix multiplication of the first H matrix and the upstream data expressed as a (N×1) matrix.

7. The error processing circuit of claim 6,
wherein the second parity is of K bits, where K is an integer equal to or greater than 2, and the second H matrix is a (K×N) matrix, and
wherein the second H matrix calculation circuit generates the second parity by calculating matrix multiplication of the second H matrix and the upstream data expressed as the (N×1) matrix.

8. An error processing circuit comprising:
a first H matrix calculation circuit configured to calculate a first H matrix and downstream data to generate a partial first downstream parity, during a decoding operation;
a second H matrix calculation circuit configured to calculate a second H matrix and the downstream data to generate a second downstream parity, during the decoding operation;
a parity restoration circuit configured to sum a first parity and a second parity to generate a restored partial first parity, during the decoding operation;
a first syndrome calculation circuit configured to sum the restored partial first parity and the partial first downstream parity to generate a first syndrome, during the decoding operation;
a second syndrome calculation circuit configured to sum the second parity and the second downstream parity for the decoding operation to generate a second syndrome, during the decoding operation; and
a correction circuit configured to correct an error of the downstream data based on the first syndrome and the second syndrome,
wherein the correction circuit outputs error corrected data.

9. The error processing circuit of claim 8, wherein the correction circuit determines that there is no error in the downstream data, when values of the first syndrome and the second syndrome are all '0'.

10. The error processing circuit of claim 8, wherein the correction circuit corrects the error by inverting bits corresponding to the values of the first syndrome and the second syndrome among multiple bits of the downstream data.

11. A memory comprising:
a first H matrix calculation circuit configured to calculate a first H matrix and write data to generate a partial first parity, during a write operation;
a second H matrix calculation circuit configured to calculate a second H matrix and the write data to generate a second parity, during the write operation;
a parity calculation circuit configured to sum the partial first parity and the second parity to generate a first parity, during the write operation;
a memory core configured to store the write data, the first parity, and the second parity during the write operation; and
a correction circuit is configured, based on syndromes calculated from the first H matrix and the second H matrix, to correct errors from read data read from the memory core,
wherein the correction circuit outputs error corrected read data.

12. The memory of claim 11, wherein:
the first H matrix calculation circuit is further configured to calculate the first H matrix and read data read from the memory core to generate a partial first downstream parity, during a read operation, and
the second H matrix calculation circuit is further configured to generate, during the decoding operation, a second read parity by calculating the second H matrix and the read data.

13. The memory of claim 12, further comprising:
a parity restoration circuit configured to sum the first parity and the second parity that are read from the memory core to generate a restored partial first parity, during the read operation;
a first syndrome calculation circuit configured to sum the restored partial first parity and the partial first read parity to generate a first syndrome, during the read operation;
a second syndrome calculation circuit configured to sum the second read parity and the second parity to generate a second syndrome, during the read operation,
wherein the correction circuit is configured to correct an error of the read data based on the first syndrome and the second syndrome.

14. The memory of claim 13, wherein the correction circuit determines that there is no error in the read data, when values of the first syndrome and the second syndrome are all '0'.

15. The memory of claim 13, wherein the correction circuit corrects the error by inverting bits corresponding to the values of the first syndrome and the second syndrome among multiple bits of the read data.

16. The memory of claim 12,
wherein the write data are of N bits, where N is an integer equal to or greater than 2, the first parity is of M bits, where M is an integer equal to or greater than 2, and the first H matrix is a (M×N) matrix, and
wherein the first H matrix calculation circuit generates the partial first parity by calculating matrix multiplication of the first H matrix and the write data expressed as a (N×1) matrix.

17. The memory of claim 16,
wherein the second parity is of K bits, where K is an integer equal to or greater than 2, and the second H matrix is a (K×N) matrix, and
wherein the second H matrix calculation circuit generates the second parity by calculating matrix multiplication of the second H matrix and the write data expressed as the (N×1) matrix.

18. A method for operating a memory, the method comprising:
receiving write data;
calculating matrix multiplication of a first H matrix and the write data to generate a partial first parity;
calculating matrix multiplication of a second H matrix and the write data to generate a second parity;
summing the partial first write parity and the second parity to generating a first parity;
storing the write data, the first parity, and the second parity in a memory core;
correcting errors in read data read from the memory based on syndromes calculated from the first H matrix and the second H matrix; and
outputting error corrected read data.

19. The method of claim 18, further comprising:
reading read data and first and second parities that correspond to the read data from the memory core;
calculating matrix multiplication of the first H matrix and the read data to generate a partial first read parity;
calculating matrix multiplication of the second H matrix and the read data to generate a second read parity;
summing the first and second parities that correspond to the read data to generate a restored partial first parity;
summing the restored partial first parity and the partial first read parity to generate a first syndrome;
summing the second parity corresponding to the read data and the second read parity to generate a second syndrome;
correcting an error of the read data based on the first syndrome and the second syndrome; and
outputting the error-corrected read data.

* * * * *